United States Patent
Feenstra et al.

(10) Patent No.: US 8,296,942 B2
(45) Date of Patent: Oct. 30, 2012

(54) PROCESS FOR PREPARING A HEATSINK SYSTEM AND HEATSINK SYSTEM OBTAINABLE BY SAID PROCESS

(75) Inventors: Frits Kornelis Feenstra, Nuenen (NL); Jürgen Hackert, Grünbach (DE)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 433 days.

(21) Appl. No.: 12/300,499

(22) PCT Filed: May 10, 2007

(86) PCT No.: PCT/NL2007/050203
§ 371 (c)(1), (2), (4) Date: Mar. 31, 2009

(87) PCT Pub. No.: WO2007/133074
PCT Pub. Date: Nov. 22, 2007

(65) Prior Publication Data
US 2009/0242239 A1    Oct. 1, 2009

(30) Foreign Application Priority Data

May 12, 2006  (EP) .................................. 06076041

(51) Int. Cl.
*H05K 3/02* (2006.01)
*H05K 3/36* (2006.01)
*H05K 3/20* (2006.01)
*H05K 3/00* (2006.01)
*H05K 1/00* (2006.01)

(52) U.S. Cl. ............... 29/846; 29/830; 29/831; 29/842; 29/844; 174/252

(58) Field of Classification Search .................. 174/252; 156/233, 234, 283, 51–53; 427/292, 470; 29/831, 830, 842, 844, 846
See application file for complete search history.

(56) References Cited

U.S. PATENT DOCUMENTS

| | | | |
|---|---|---|---|
| 2,988,839 A * | 6/1961 | Greenman et al. ............. | 156/251 |
| 4,315,845 A * | 2/1982 | Takahashi et al. ............. | 523/400 |
| 4,495,232 A * | 1/1985 | Bauser et al. ................. | 428/40.2 |
| 4,784,893 A * | 11/1988 | Nishimoto et al. ........... | 428/209 |
| 4,959,116 A * | 9/1990 | Tsuji ............................. | 156/283 |
| 5,178,902 A * | 1/1993 | Wong et al. ................... | 427/470 |
| 5,213,868 A * | 5/1993 | Liberty et al. ................. | 428/131 |
| 5,718,789 A * | 2/1998 | Gebhardt et al. .............. | 156/154 |

(Continued)

FOREIGN PATENT DOCUMENTS
EP         0 282 078 Y      9/1988

(Continued)

*Primary Examiner* — Timothy Thompson
*Assistant Examiner* — Sherman Ng
(74) *Attorney, Agent, or Firm* — Lucas & Mercanti, LLP

(57) ABSTRACT

The invention provides a process for preparing a heatsink system for a heat generating electronic device, comprising the steps of:
(a) providing a heat conducting substrate;
(b) applying an insulating layer on the heat conducting substrate; and
(c) applying a printed circuit on the isolating layer by means of a hot embossing system. The invention further provides a heatsink system obtainable by said process, comprising a heat conducting substrate, an insulating layer that is applied on the heat conducting substrate, and a printed circuit that is applied on the insulating layer, wherein the thickness of the part of the insulating layer which is arranged between the heat conducting substrate and the printed circuit is between 1 and 100 micron.

14 Claims, 2 Drawing Sheets

The hot embossing process finished: the foil is hot embossed into the insulated layer covering the heat conducting substrate

U.S. PATENT DOCUMENTS

| | | | |
|---|---|---|---|
| 5,725,706 A * | 3/1998 | Thoma et al. | 156/150 |
| 5,772,905 A * | 6/1998 | Chou | 216/44 |
| 5,886,400 A * | 3/1999 | Letterman et al. | 257/675 |
| 5,980,679 A * | 11/1999 | Severin et al. | 156/233 |
| 6,059,914 A * | 5/2000 | Suss | 156/230 |
| 6,146,709 A * | 11/2000 | Katz et al. | 427/447 |
| 6,517,995 B1 * | 2/2003 | Jacobson et al. | 430/320 |
| 2005/0164480 A1 * | 7/2005 | Haubrich et al. | 438/597 |

FOREIGN PATENT DOCUMENTS

| | | |
|---|---|---|
| EP | 0 924 761 A | 6/1999 |
| EP | 924761 A1 * | 6/1999 |
| GB | 2 206 451 YX | 1/1989 |
| GB | 2206451 A * | 1/1989 |
| WO | 98/37740 Y | 8/1998 |

* cited by examiner

Typical geometry for hot embossing tool for power LED heat sink device.

The hot embossing process finished:

the foil is hot embossed into the insulated layer covering the heat conducting substrate

PROCESS FOR PREPARING A HEATSINK SYSTEM AND HEATSINK SYSTEM OBTAINABLE BY SAID PROCESS

This application is a 371 of PCT/NL2007/050203 filed May 10, 2007, which claims the priority of EP 06076041.0 filed May 12, 2006, both of which are hereby incorporated by reference.

The present invention relates to a process for preparing a heatsink system and a heatsink system obtainable by said process.

Heatsinks are well-known devices that are used to guide heat away from heat sources, helping to dissipate the energy, thus ensuring that the heat sources are kept cooler. Heatsinks are widely used in microprocessor chips or other power handling semiconductor systems such as diode lasers or light emitting devices (LEDs). LEDs are nowadays broadly used in light applications. A problem with the application of LEDs having a higher electric power, so-called power LEDs, is that they generate much heat that needs to be adequately guided away because otherwise the efficiency of the LEDs will decline and/or complete failure of the LEDs may occur. Consequently, in light of the heat generated by each LED, in the currently used light sources only a limited number of LEDs are applied per square cm.

Object of the present invention is to provide a heatsink which allows a considerable increase of the number of LEDs to be used per square cm, allowing the use of such heatsinks for heat generating electronic devices such as, for example, in the application of power LEDs in headlights of cars. Another important application of such a heatsink is the use of power LEDS or other type of LEDs such as SSL-LEDs for digital grow light in illumination systems for greenhouses.

Surprisingly, it has now been found that such a heatsink can be prepared when an insulating layer is applied on a heat conducting substrate and a printed circuit is applied on the insulating layer by means of a hot embossing system.

Figure 1:
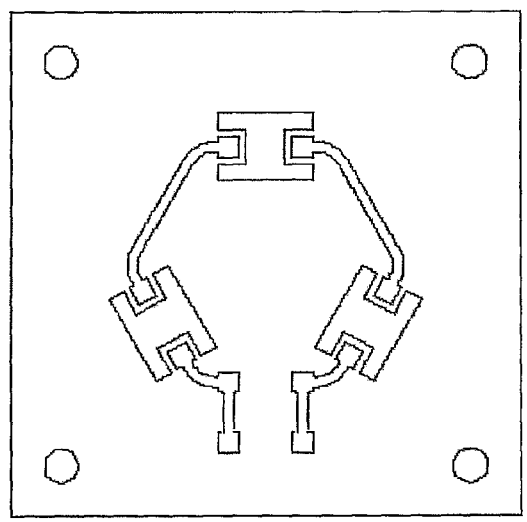

FIG. 1 shows a typical geometry of a printed circuit to be used in accordance with the present invention.

Figure 2:
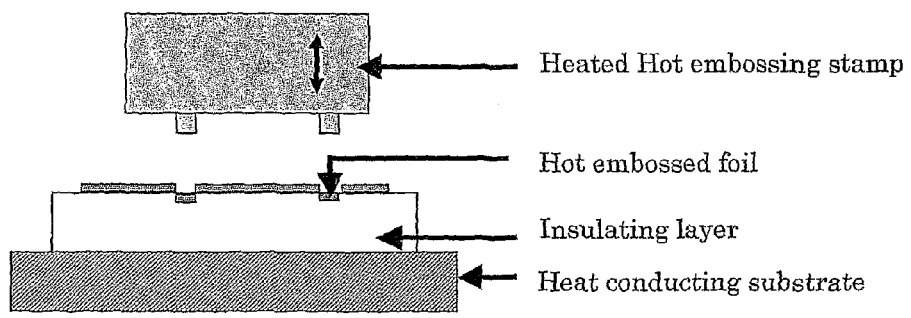

FIG. 2 schematically shows a heatsink in accordance with the present invention.

Accordingly, the present invention relates to a process for preparing a heatsink system for a heat generating electronic device, comprising the steps of:
(a) providing a heat conducting substrate;
(b) applying an insulating layer on the heat conducting substrate; and
(c) applying a printed circuit on the isolating layer by means of a hot embossing system.

The present invention advantageously allows for the preparation of heatsinks, wherein the thickness of the part of the insulating layer that is arranged between the heat conducting substrate and the printed circuit can be far less than those presently applied. In accordance with the present invention a thickness of the insulating layer can be obtained in the range of from 1 to 100 micron, which is unique and brings about a much more effective heat removal, allowing the attractive use of much more LEDs per square cm.

Preferably, the heat conducting substrate comprises a metal substrate, inorganic semi-conductive substrate or a ceramic substrate. More preferably, the heat conducting substrate comprises a metal substrate.

Suitably, the metal to be used in the metal substrate is selected from the group consisting of copper, gold, silver, aluminium, iron, bronze, magnesium, titanium, stainless steel, zinc, nickel, chromium, lead, platinum, tungsten, or any alloy thereof.

Preferably, the metal comprises aluminium, iron, stainless steel or copper.

More preferably, the metal is aluminium.

In a special embodiment of the invention, the metal substrate which is used as the heat conducting substrate has been pretreated by means of an anodisation process. Hence, preferably the metal substrate is an anodised metal substrate. In that way electric isolating properties of the surface are obtained. More preferably, anodised aluminium is used as the anodised metal substrate.

Suitably, in accordance with the present invention the insulating layer comprises a polymer based binder material. In other words, the polymer based binder material from which the insulating layer will be formed comprises a polymer based binder material.

Suitable examples of the polymer based binder materials include thermoplastic and thermoset powders.

Preferably, the polymer based binder material comprises epoxies, acrylics, polyesters or hybrids thereof. More preferably, the binder material comprises epoxies or acrylics.

In accordance with the present invention, in step (b) the insulating layer can be applied on the heat conducting substrate using a wide variety of techniques.

In the process according to the present invention, in step (b) the insulating layer can suitably be applied on the heat conducting substrate by a process selected from the group consisting of powder coating, air brushing, painting, screen printing, curtain coating, slot die, gravure, spin coating, sol gel coating, flexo printing and transfer printing. Preferably, the insulating material from which the isolating layer is formed is applied on the heat conducting substrate by means of a powder coating technique.

Preferably, the insulating material from which the isolating layer is formed further comprises a filler compound for providing improved conductivity of heat.

Preferably, in step (b) the insulating material that is to be coated in the form of an isolating layer on the heat conducting substrate further comprises a chemically or heat activatable adhesive. In this way a adhesive is rendered tacky or fluid by application of heat and/or pressure resulting in excellent adhesion of the circuit onto the insulating layer.

The printed circuit to be used in accordance with the present invention suitably would have a typical geometry as described in FIG. 1 The hot embossing system to be used in accordance with the present invention can be any of the known embossing systems. In case of hot embossing with a copper foil, this foil is treated on one side to provide a fine voided structure. The foil should be quite brittle so that it can be cut cleanly later in the process after the fusion step. It is laid over the substrate that will become the basis structure for a power LED device. A heated embossing tool, with its cutting edges machined into the form of the circuitry to be embossed, stamps the foil onto the substrate. The soft insulating layer flows into the fine surface structure to provide adhesion between the copper tracks and the substrate, after which the residual copper between the tracks is removed. The heatsink obtained in this way is schematically shown in FIG. 2.

The present invention further relates to a heatsink system obtainable by a process in accordance with the present invention, which heatsink system comprises a heat conducting substrate, an insulating layer that is applied on the heat conducting substrate, and a printing circuit that is applied on the insulating layer, wherein the thickness of the part of the insulating layer which is arranged between the heat conducting substrate and the printed circuit is between 1 and 100 micron.

Preferably, the thickness of the part of the insulating layer which is arranged between the heat conducting substrate and the printed circuit is between 1 and 75 micron, more preferably in the range of from 5 to 50 micron.

The heatsink in accordance with the present invention allows a considerable increase of the number of LEDs to be used per square cm. Hence, the present heatsink can advantageously be used for heat generating electronic devices such as, for example, in the application of power LEDs in headlights of cars. Another important application of the present heatsink is the use of power LEDS or other type of LEDs, such as SSL-LEDs for digital grow light in illumination systems for greenhouses.

The present invention relates therefore also to the use of the present heatsink in a heat generating device.

The invention claimed is:

1. A process for preparing a heatsink system for a heat generating electronic device, comprising the steps of:
   (a) providing a heat conducting substrate;
   (b) applying a thermoset powder polymer based binder material insulating layer on the heat conducting substrate; and
   (c) applying a printed circuit directly on the thermoset powder polymer based binder material insulating layer by means of a hot embossing system,
   wherein step (c) comprises:
   treating a first side of a copper foil to provide a fine voided structure;
   providing the treated copper foil on the insulating layer;
   stamping at least a portion of the copper foil on the insulating layer with a heated embossing tool,
   wherein the insulating layer flows into the fine voided structure of the copper foil to provide adhesion between the copper foil and the insulating layer, and
   removing residual copper which was not stamped on the insulating layer.

2. A process according to claim 1, wherein the heat conducting substrate comprises a metal substrate, inorganic semiconductive substrate or a ceramic substrate.

3. A process according to claim 2, wherein the heat conducting substrate comprises a metal substrate.

4. A process according to claim 2, wherein the metal is selected from the group consisting of copper, gold, silver, aluminium, iron, bronze, magnesium, titanium, stainless steel, zinc nickel, chromium, lead, platinum, tungsten, or any alloy thereof.

5. A process according to claim 4, wherein the metal is aluminium.

6. A process according to claim 3, wherein the metal substrate has been pretreated by means of an anodisation process.

7. A process according to claim 1, wherein the insulating layer comprises a polymer based binder material.

8. A process according to claim 1, wherein in step (b the insulating layer is applied on the heat conducting layer by a process selected from the group consisting of powdercoating, air brushing, painting, screen printing, curtain coating, 5 slot die, gravure, spin coating, sol gel coating, flexo printing and transfer printing.

9. A process according to claim 1, wherein in step (b) the insulating layer is applied on the heat conducting substrate by means of a powder coating technique.

10. A process according to claim 1, wherein the insulating layer further comprises a filler compound for providing improved conductivity of heat.

11. A process according to claim 1, wherein in step (b) the insulating material that is to be coated in the form of an insulating layer on the heat conducting substrate further comprises a chemically or heat activatable adhesive.

12. A heatsink system obtainable by a process as defined in claim 1, comprising a heat conducting substrate, an insulating layer comprising a thermoset powder polymer based binder material that is applied on the heat conducting substrate, and a printed circuit that is applied on the insulating layer, wherein the thickness of the part of the insulating layer which is arranged between the heat conducting substrate and the printed circuit is between 1 and 100 micron.

13. A system according to claim 12, wherein the thickness of the part of the insulating layer which is arranged between the heat conducting substrate and the printed circuit is between 5 and 75 micron.

14. A method for applying a printed circuit on an insulating layer provided on a heat conducting substrate by hot embossing using a copper foil, comprising the steps of: treating a first side of the copper foil to provide a fine voided structure; providing the treated copper foil on the insulating layer such that the first side of the copper foil contacts the insulating layer; stamping at least a portion of the copper foil on the insulating layer with a heated embossing tool, wherein the insulating layer flows into the fine voided structure of the copper foil to provide adhesion between the copper foil and the insulating layer; and removing residual copper which was not stamped on the insulating layer.

* * * * *